United States Patent
Brucker

(10) Patent No.: US 6,328,856 B1
(45) Date of Patent: Dec. 11, 2001

(54) METHOD AND APPARATUS FOR MULTILAYER FILM DEPOSITION UTILIZING ROTATING MULTIPLE MAGNETRON CATHODE DEVICE

(75) Inventor: Charles Frederick Brucker, Pleasanton, CA (US)

(73) Assignee: Seagate Technology LLC, Scotts Valley, CA (US)

(*) Notice: Subject to any disclaimer, the term of this patent is extended or adjusted under 35 U.S.C. 154(b) by 0 days.

(21) Appl. No.: 09/521,463

(22) Filed: Mar. 8, 2000

Related U.S. Application Data

(60) Provisional application No. 60/147,296, filed on Aug. 4, 1999, now abandoned.

(51) Int. Cl.[7] ............ C23C 14/06; C23C 14/34; C23C 14/35
(52) U.S. Cl. .............. 204/192.12; 204/192.15; 204/192.2; 204/298.26; 204/298.18; 204/298.12; 204/298.19; 204/298.23; 204/298.28; 204/298.11
(58) Field of Search ............. 204/192.12, 192.2, 204/298.11–298.28

(56) References Cited

U.S. PATENT DOCUMENTS

| | | | |
|---|---|---|---|
| 2,886,502 | 5/1959 | Holland | 204/192.12 |
| 3,515,663 | 6/1970 | Bodway | 204/298.06 |
| 3,537,973 | 11/1970 | Herte et al. | 204/298.26 |
| 3,664,948 | 5/1972 | Graffeo, Jr. et al. | 204/298.11 |
| 3,756,939 | 9/1973 | Hurwitt | 204/192.12 |
| 3,864,239 | 2/1975 | Fletcher et al. | 204/298.06 |
| 4,021,277 | 5/1977 | Shirn et al. | 204/298.08 |
| 4,322,276 | 3/1982 | Meckel et al. | 204/192.26 |
| 4,415,427 | 11/1983 | Hidler et al. | 204/298.26 |
| 4,465,575 | 8/1984 | Love et al. | 204/192.26 |
| 4,591,418 | 5/1986 | Snyder | 204/192.16 |
| 4,851,095 | 7/1989 | Scobey et al. | 204/192.12 |
| 4,923,585 | 5/1990 | Krauss et al. | 204/298.04 |
| 4,952,295 | 8/1990 | Kawabata et al. | 204/192.15 |
| 5,068,022 | * 11/1991 | Carcia | 204/192.2 |
| 5,279,724 | 1/1994 | Rauch et al. | 204/298.09 |
| 5,363,794 | 11/1994 | Lairson et al. | 117/7 |
| 5,556,519 | 9/1996 | Teer | 204/192.12 |
| 5,612,109 | 3/1997 | Tyan et al. | 428/69.1 |
| 5,660,693 | 8/1997 | Abramson et al. | 204/192.12 |
| 5,674,366 | * 10/1997 | Hayashi et al. | 204/298.23 |
| 5,851,363 | * 12/1998 | Miller et al. | 204/192.2 |
| 5,875,169 | 2/1999 | Hatwar | 369/272 |
| 6,051,113 | * 4/2000 | Moslehi | 204/298.26 |

FOREIGN PATENT DOCUMENTS

| | | | |
|---|---|---|---|
| 94/19508 | * 9/1994 | (WO) | 204/192.15 |

OTHER PUBLICATIONS

Anelva Corporation, C–3010 Sputtering System Shuttle Type, Co–Sputtering System & Process Update, MMD Equipement Div., 1st Engineering Dept., Jan. 27, 2000.

* cited by examiner

Primary Examiner—Mark F. Huff
Assistant Examiner—Daborah Chacko-Davis
(74) Attorney, Agent, or Firm—McDermott, Will & Emery

(57) ABSTRACT

An apparatus for forming a multilayer film on a substrate surface comprises a multi-target sputtering source having a planar end face adapted for rotation about a central axis and including at least a pair of independently operable planar magnetron cathodes having sputtering targets composed of different materials, and a substrate mounting means for providing a stationary substrate in spaced-apart, facing relation to the sputtering source. According to the inventive method, the multi-target source is rotated about its central axis while the substrate is maintained stationary, thereby depositing a multi-layer film stack on the substrate. The invention finds particular utility in the formation of super-lattice structures usable as recording medium layers in the fabrication of magnetic and magneto-optical (MO) data/information storage and retrieval media.

20 Claims, 3 Drawing Sheets

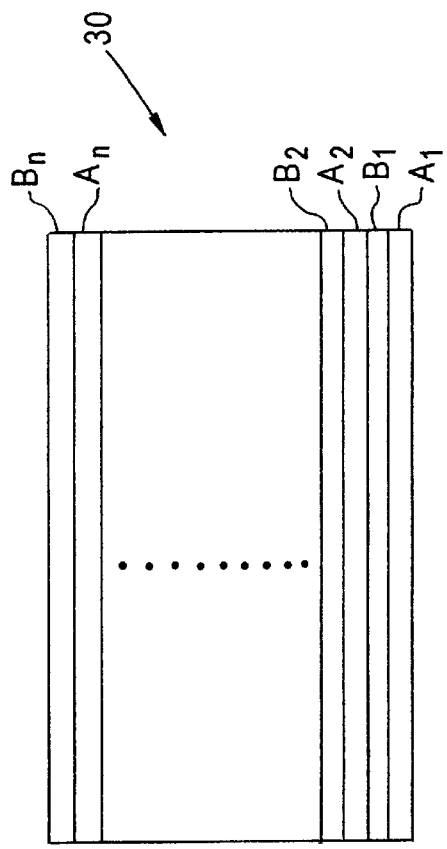
FIG. 3
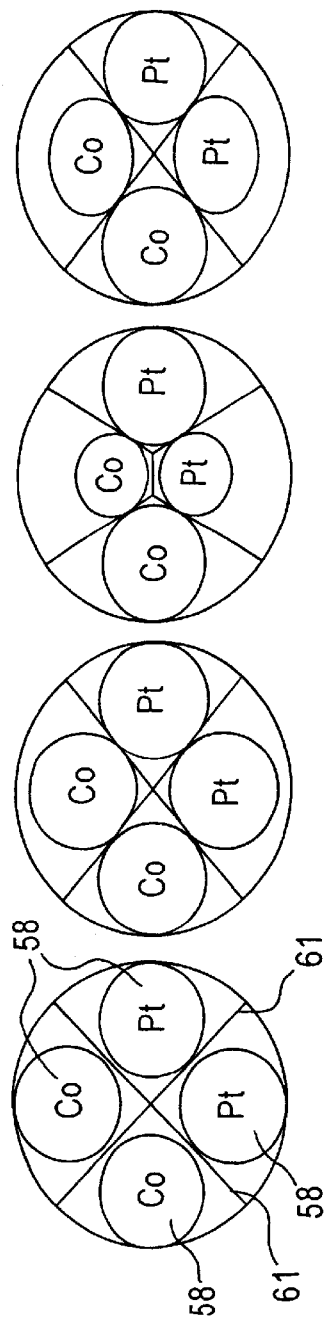
FIG. 5(A) Symmetrical
FIG. 5(B) Asymmetrical
FIG. 5(C) Multiple Size
FIG. 5(D) Tilted

METHOD AND APPARATUS FOR MULTILAYER FILM DEPOSITION UTILIZING ROTATING MULTIPLE MAGNETRON CATHODE DEVICE

CROSS-REFERENCE TO PROVISIONAL APPLICATION

This application claims priority from U.S. provisional application Ser. No. 60/147,296 filed Aug. 4, 1999 abandoned, the entire disclosure of which is incorporated herein by reference.

FIELD OF THE INVENTION

The present invention relates to a method and apparatus for performing multilayer film deposition on a substrate surface, e.g., a disk-shaped substrate, which method and apparatus utilizes a rotating multiple magnetron cathode sputtering device. The invention has particular utility in the formation of superlattice structures, e.g., $(Co/Pt)_n$ and $(Co/Pd)_n$ superlattices, as part of automated manufacture of magnetic and magneto-optical (MO) data/information storage and retrieval media in disk form.

BACKGROUND OF THE INVENTION

Magnetic and magneto-optical media are widely employed in various applications, particularly in the computer industry for data/information storage and retrieval purposes. A conventional, single-sided, longitudinal magnetic recording medium 1 in e.g., disk form, such as utilized in computer related applications, is schematically depicted in FIG. 1 and comprises a non-magnetic substrate 10, e.g., of glass, ceramic, glass-ceramic composite, polymer, metal, or metal alloy, typically an aluminum (Al)-based alloy such as aluminum-magnesium, having at least one major surface on which a layer stack comprising a plurality of thin film layers constituting the medium are sequentially deposited. Such layers typically include a plating layer 11, as of amorphous nickel-phosphorus (NiP), a polycrystalline underlayer 12, typically of chromium (Cr) or a Cr-based alloy, a magnetic recording layer 13, e.g., of a cobalt (Co)-based alloy, a protective overcoat layer 14, typically containing carbon (C), e.g., diamond-like carbon (DLC), and a lubricant topcoat layer 15, typically of a perfluoropolyether compound.

Magneto-optical (MO) recording media (MO) similarly comprise a laminate of layers formed over a suitable substrate, e.g., a disk. By way of illustration, shown in FIG. 2 is a single-sided MO medium 20 having a first surface magneto-optical (FSMO) layer configuration, wherein reference numeral 21 denotes a disk-shaped substrate formed of a material selected from, for example, aluminum (Al), plated aluminum, aluminum alloys, metals, metal alloys, glass, ceramics, and glass-ceramic composite materials. Formed on one surface 21A of substrate 21 is a layer stack, comprising, in sequence from surface 21A, a reflective, heat sinking layer 22, comprising Al or an alloy thereof, e.g., AlCr, AlTi, AlCu, AlMo, etc., which layer may also serve to prevent laser beam transmission through the substrate when the latter is transparent, as in the case of glass or glass-based materials, and thus render surface 21A opaque; a first dielectric material layer 23, substantially transparent to the wavelength(s) of the at least one laser beam employed for writing and reading out information stored in the medium, typically selected from $SiN_x$, $AlN_x$, $SiO_x$, and $AlO_x$; a MO read-write layer 24, for example, comprising a rare earth-transition metal thermo-magnetic (RE-TM) material having perpendicular magnetic anisotropy, large perpendicular coercivity $H_c$ at room temperature, and high Curie temperature $T_c$, typically selected from TbFe, TbFeCo, TbDyFeCo, etc.; a second transparent dielectric material 25 typically selected from the same materials utilized for the first transparent dielectric layer 23; a thin, amorphous, diamond-like carbon (DLC) protective overcoat layer 26; and a lubricant topcoat layer 27, typically comprising a fluoropolyether or perfluoropolyether material.

A promising new class of materials suitable for use as the magnetic recording layer 13 of the magnetic medium of FIG. 1 or the MO read-write layer 24 of the magneto-optical (MO) medium of FIG. 2 includes cobalt/platinum $(Co/Pt)_n$ and cobalt-palladium $(Co/Pd)_n$ multilayer stacks, also referred to as "superlattice" structures. As schematically illustrated in FIG. 3, such multilayer stacks or superlattice structures 30 comprise n pairs of alternating discrete layers of Co (designated by letter A in the drawing) and Pt or Pd (designated by letter B in the drawing), where n=an integer between about 10 and about 30. Superlattice 30 is typically formed by a suitable vapor deposition technique and can exhibit perpendicular magnetic anisotropy arising from metastable chemical modulation in the direction normal to the substrate. Compared to conventional cobalt-chromium (Co—Cr) alloys utilized in magnetic data storage/retrieval disk applications, such $(Co/Pt)_n$ and $(Co/Pd)_n$ multilayer or superlattice structures offer an economic advantage in facilitating room temperature deposition processing necessary for utilization of lower cost polymeric substrates. When utilized in MO disk-based applications, $(Co/Pt)_n$ and $(Co/Pd)_n$ superlattices offer superior corrosion resistance and blue wavelength response vis-à-vis conventional RE-TM alloys.

For example, a $(Co/Pt)_n$ multilayer stack or superlattice 30 suitable for use as the magnetic recording layer 13 of the magnetic recording medium of FIG. 1 or the magneto-optical (MO) read-write layer 24 of the MO medium of FIG. 2 can comprise a plurality of Co/Pt pairs, i.e., n=about 10 to about 30, e.g., 13, wherein each Co/Pt pair consists of a 3 Å thick Co layer adjacent to an 8 Å thick Pt layer, for a total of 26 separate or discrete layers. When utilized as a high recording density magneto-optical (HDMO) read-write layer 24 in e.g., a MO medium as illustrated in FIG. 2, such multilayer stacks or superlattice structures 30 are characterized by having a large perpendicular anisotropy and high coercivity, high squareness ratio (S) for a magnetic hysteresis (M-H) loop measured in the perpendicular direction, and high Kerr rotation angle for light of a particular wavelength region, e.g., blue or red light. By way of illustration, but not limitation, $(Co/Pt)_n$ and $(Co/Pd)_n$ HDMO superlattices, wherein n=about 10 to about 30 pairs of Co and Pt or Pd layers having thicknesses as indicated supra and fabricated, e.g., by means of techniques disclosed in U.S. Pat. No. 5,750,270, the entire disclosure of which is incorporated herein by reference, exhibit perpendicular anisotropy exceeding about $2 \times 10^6$ erg/cm$^3$; coercivity as high as about 5,000 Oe; squareness ratio (S) of a M-H loop, measured in the perpendicular direction, of from about 0.85 to about 1.0; and carrier-to-noise ratio (CNR) of from about 30 dB to about 60 dB.

According to conventional methodologies and practices for automated manufacture of disk-shaped magnetic and MO media, when the various above-described thin film layers constituting the medium are deposited on the disk-shaped substrates, as by cathode sputtering techniques, it is generally advantageous to coat one disk at a time with the various requisite layers. However, the continuing requirement for increased storage density has increased the number of requisite layers and, as the number of requisite layers increases, it becomes impractical to build and operate multi-chamber cathode sputtering apparatus wherein each separate or discrete layer to be deposited requires a separate sputtering cathode/target assembly and associated vacuum chamber because either the system becomes unwieldy as a result of its great length in the case of linearly-arranged deposition systems, or in the case of circularly-configured systems, the diameter of the circle becomes too large.

The above-described difficulty associated with increasing numbers of requisite layers is magnified in the case of recording media comprising $(Co/Pt)_n$ or $(Co/Pd)_n$ multilayer stacks or superlattice structures where n=about 10 to about 30 layer pairs due to the very large number of individual layers required to be deposited. Currently available disk processing apparatus, whether pallet pass-by, single disk, or some variation thereof, do not have an adequate cathode count for single-pass coating of a large number of layers. Certain types of existing sputtering apparatus can be modified to perform multiple pass, back-and-forth, or up-and-down repetitive disk transport to fabricate multilayer stacks with a limited number of sputtering cathodes, but such reduction in cathode number incurs a significant reduction in productivity, hence increased manufacturing cost. Other types of existing sputtering apparatus, e.g., the Intevac MDP style frequently utilized for magnetic and MO recording disk manufacture, transport each disk with an intermittent up-and-down motion which can be exploited for reducing the requisite number of coating stations; however, the required number of sputtering cathode/target assemblies cannot be reduced.

It is considered that a method and apparatus for forming multilayer stacks or superlattice structures which minimizes the requisite number of sputtering cathode/target assemblies without sacrificing productivity is required for realizing economically viable manufacture of $(Co/Pt)_n$ and $(Co/Pd)_n$ superlattice-based magnetic and/or MO recording media. One possible approach for achieving such result is to utilize nested, annularly-shaped, independently powered Co and Pt or Pd sputtering cathodes/targets which can be alternately energized to sputter discrete layers of Co and Pt or Pd to form a multilayer stack. However, this approach entails several drawbacks, e.g., fabrication of the annularly-shaped targets is expensive, the cathode/target structure is mechanically complex, and there is limited control of the film thickness and properties in the radial direction.

Another approach involves providing an array of sputtering cathodes/targets and rotating the substrate pallet or individual disk in facing relation to the cathode/target array. However, this approach raises concerns of machine reliability and cleanliness resulting from the additional motion of coated parts and mechanical linkages in the vacuum system, particularly in the case of manufacture of dual-sided media.

Accordingly, there exists a need for improved means and methodology for forming, as by cathode sputtering, multi-layer stacks or superlattice structures, for use in e.g., single- and dual-sided magnetic and/or MO data/information storage and retrieval media in disk form, which means and methodology form part of a multi-station processing apparatus and enable rapid, simple, and cost-effective formation of such media by forming multilayer stacks or superlattice structures via sputtering utilizing a single, rotating multiple-cathode/target assembly and a stationary substrate.

The present invention, wherein multilayer or superlattice structures are formed according to a different approach utilizing a single, rotating multiple magnetron cathode/target assembly and a stationary substrate, effectively addresses and solves problems attendant upon the use of sputtering techniques for the manufacture of, inter alia, high recording density, thin film magnetic and MO media, while maintaining full compatibility with all aspects of conventional automated manufacturing technology. Further, the means and methodology provided by the present invention enjoy diverse utility in the manufacture of other devices and products requiring multilayer thin film coatings.

DISCLOSURE OF THE INVENTION

An advantage of the present invention is an improved method for magnetron sputter deposition of multilayer stacks or superlattice structures of different target materials onto a substrate surface.

A further advantage of the present invention is an improved method of utilizing a rotatable, multicathode planar magnetron sputtering device for depositing multiple thin film layers of different target materials onto a stationary substrate surface.

A still further advantage of the present invention is an improved method for forming thin film, high recording density magnetic and/or magneto-optical (MO) data/information storage and retrieval media including multilayer stacks or superlattice structures.

Yet another advantage of the present invention is an improved rotatable, multi magnetron cathode sputtering apparatus for depositing multiple thin film layers of different target materials onto a substrate surface.

Still another advantage of the present invention is an improved rotating multi-cathode planar magnetron sputtering apparatus for forming thin film, high recording density magnetic and/or magneto-optical (MO) data/information storage and retrieval media comprising multilayer stacks or superlattice structures.

Additional advantages and other features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to one aspect of the present invention, the foregoing and other advantages are obtained in part by a method of forming a multilayer thin film on a substrate surface, which method comprises the steps of:

(a) providing a sputtering source having a planar end face with a central axis for rotation thereabout, the end face comprising at least one pair of first and second independently operable cathodes positioned in an array about the central axis and including respective first and second sputtering targets comprised of first and second materials;

(b) providing a substrate having a surface for deposition thereon in spaced-apart facing relation to the first and second sputtering targets;

(c) sputtering the first and second targets while rotating the end face of the sputtering source about the central axis and maintaining the substrate stationary, thereby depositing a multilayer thin film on the substrate surface, the multilayer thin film comprising alternating layers of the first and second materials.

According to embodiments of the present invention, step (a) comprises providing a sputtering source including at least one pair of first and second planar magnetron cathodes and shielding means between the cathodes for substantially reducing or eliminating contamination of the sputtered particle flux from each sputtering target.

According to further embodiments of the present invention, step (a) comprises providing a sputtering source including two pairs of first and second planar magnetron cathodes.

According to still further embodiments of the present invention, step (a) comprises providing a sputtering source wherein each of the planar magnetron cathodes includes a sputtering target having a circularly-shaped sputtering surface.

According to yet further embodiments of the present invention, step (a) comprises providing a sputtering source wherein two pairs of the circularly-shaped sputtering surfaces are arranged in a symmetrical or unsymmetrical array about the central axis.

According to other embodiments of the present invention, step (a) comprises providing a sputtering source wherein one pair of the circularly-shaped sputtering surfaces is of a first, larger diameter, the other pair of the circularly-shaped sputtering surfaces is of a second, smaller diameter, and the two pairs of sputtering surfaces are arranged in a symmetrical array about the central axis. According to yet other embodiments of the present invention, one pair of first and second planar magnetron cathodes includes first and second sputtering targets having circularly-shaped sputtering surfaces, the other pair of first and second planar magnetron cathodes includes first and second sputtering targets having circularly-shaped sputtering surfaces each of which is tilted at an angle with respect to the planar end face of the sputtering source, and the two pairs of sputtering surfaces are arranged in a symmetrical array about the central axis.

According to particular embodiments of the present invention, step (b) comprises providing a disk-shaped substrate having an annularly-shaped surface for deposition thereon; and step (c) comprises depositing a $(Co/Pt)_n$ or $(Co/Pd)_n$ multilayer stack or superlattice structure on an annularly-shaped deposition surface of a disk-shaped substrate as part of a process for forming a magnetic or magneto-optical (MO) recording medium.

According to another aspect of the present invention, an apparatus for depositing a multilayer thin film on a substrate surface comprises:

(a) a sputtering source having a planar end face adapted for rotation about a central axis, the end face comprising at least one pair of first and second independently operable cathodes positioned in an array about the central axis, the first and second cathodes adapted to mount thereon respective first and second sputtering targets comprised of first and second materials;

(b) a substrate mount for providing a substrate surface in stationary, spaced-apart, facing relation to the pair of first and second sputtering targets; and (c) means for rotating the end face of the sputtering source about the central axis.

According to embodiments of the present invention, the sputtering source (a) comprises at least one pair of planar magnetron cathodes and further includes shielding means between the cathodes for substantially reducing or eliminating contamination of the sputtered particle flux from each sputtering target.

According to further embodiments of the present invention, the sputtering source (a) comprises two pairs of first and second planar magnetron cathodes; and, according to particular embodiments of the present invention, each of the planar magnetron cathodes includes a sputtering target having a circularly-shaped sputtering surface. According to one variant of the present invention, each circularly-shaped sputtering surface is of the same diameter and the two pairs of sputtering surfaces are arranged in a symmetrical or unsymmetrical array about the central axis. According to another variant of the present invention, one pair of the circularly-shaped sputtering surfaces is of a first, larger diameter, the other pair of the circularly-shaped sputtering surfaces is of a second, smaller diameter, and the two pairs of sputtering surfaces are arranged in a symmetrical array about the central axis.

According to other embodiments of the present invention, one pair of first and second planar magnetron cathodes includes first and second targets having circularly-shaped sputtering surfaces aligned in parallel with the planar end face of the sputtering source, the other pair of first and second planar magnetron cathodes includes first and second sputtering targets having circularly-shaped sputtering surfaces each of which is tilted at an angle with respect to the planar end face of the sputtering source, and the two pairs of sputtering surfaces are arranged in a symmetrical array about the central axis.

According to yet other embodiments of the present invention, the apparatus further comprises:

(d) means for independently supplying sputtering power to each of the first and second pairs of planar magnetron cathodes; and (e) means for supplying coolant fluid to each of the magnetron cathodes.

According to still another aspect of the present invention, an apparatus for forming a multilayer thin film on a substrate surface comprises:

a sputtering source including a planar end face comprising a plurality of independently operable planar magnetron cathode sputtering targets; and means for rotating the end face about a central axis thereof.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative nature, and not as limitative.

BRIEF DESCRIPTION OF THE DRAWINGS

The following detailed description of the embodiments of the present invention can best be understood when read in conjunction with the following drawings, in which like reference numerals are employed throughout to designate similar features, wherein:

FIG. 3 schematically illustrates, in simplified cross-sectional view, a $(Co/Pt)_n$ or $(Co/Pd)_n$ superlattice structure suitable for use in the magnetic and magneto-optical (MO) media of FIGS. 1 and 2;

FIGS. 5(A)–5(D) are simplified plan views illustrating various arrangements of multiple sputtering targets according to the present invention.

DESCRIPTION OF THE INVENTION

The present invention is based upon recognition that a suitable approach for forming multilayer thin film stacks and superlattice structures suitable for use in manufacture of disk-shaped magnetic and magneto-optical (MO) recording media involves rotating an array of individually operable sputtering cathode/target assemblies facing a confronting surface of a stationary substrate. Such approach affords several advantages not attainable by the other approaches discussed supra, including, inter alia, use of inexpensive circularly-shaped targets; simple, i.e., conventional, planar magnetron cathode structures; and no loss of process cleanliness.

A key feature of the rotating multiple planar magnetron cathode sputtering source according to the present invention is the elimination of sliding water-to-vacuum seals which can compromise vacuum reliability. Briefly stated, the entire assembly of independently powered planar magnetron cathodes rotates within the interior space of the vacuum chamber or enclosure in confronting (or opposing) relation to the substrate surface on which multilayer deposition occurs. The sputtering source comprises an array of planar magnetron cathodes each mounting thereon a circularly-shaped sputtering target, which array of magnetron cathodes is in turn mounted on a base plate via vacuum-sealed feedthroughs for supplying each cathode with coolant fluid and electrical power. A feedthrough housing is in turn vacuum-sealed to the base plate via vacuum-sealed feedthroughs and to the vacuum chamber or enclosure (stationary) via rotary vacuum seals. The rotary vacuum seals provide for rotation of the entire sputtering source around a central axis normal to the base plate surface.

Figure 1:
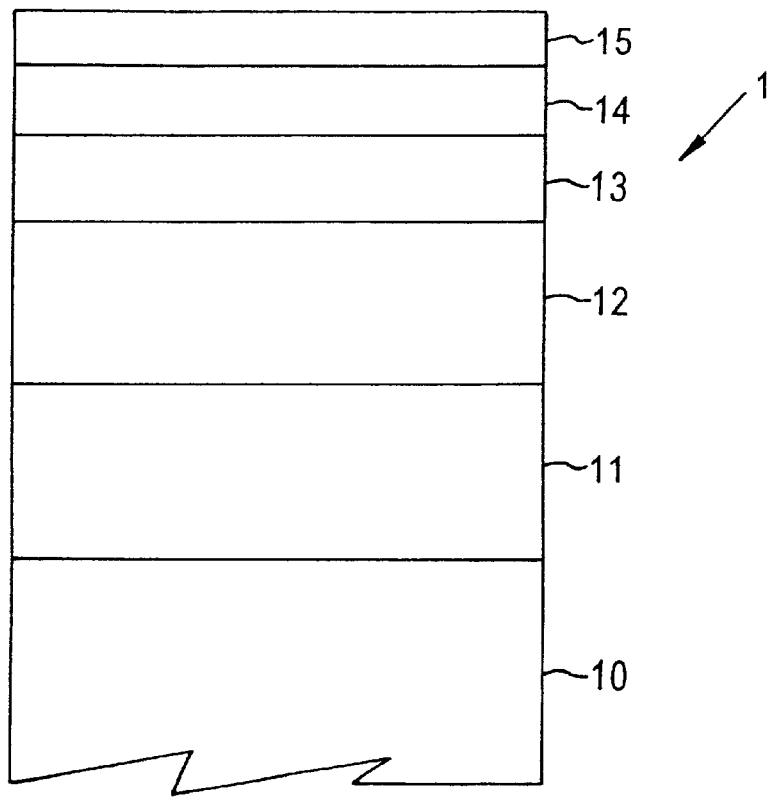
FIG. 1 schematically illustrates, in simplified cross-sectional view, a conventional magnetic data/information recording and retrieval medium.
Figure 2:
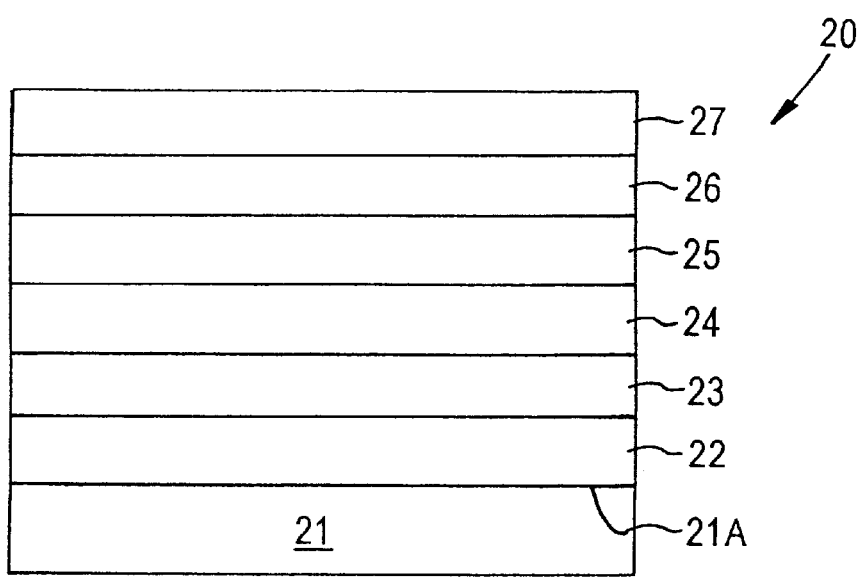
FIG. 2 schematically illustrates, in simplified cross-sectional view, a typical first surface magneto-optical (FSMO) data/information recording and retrieval medium.
Figure 4:
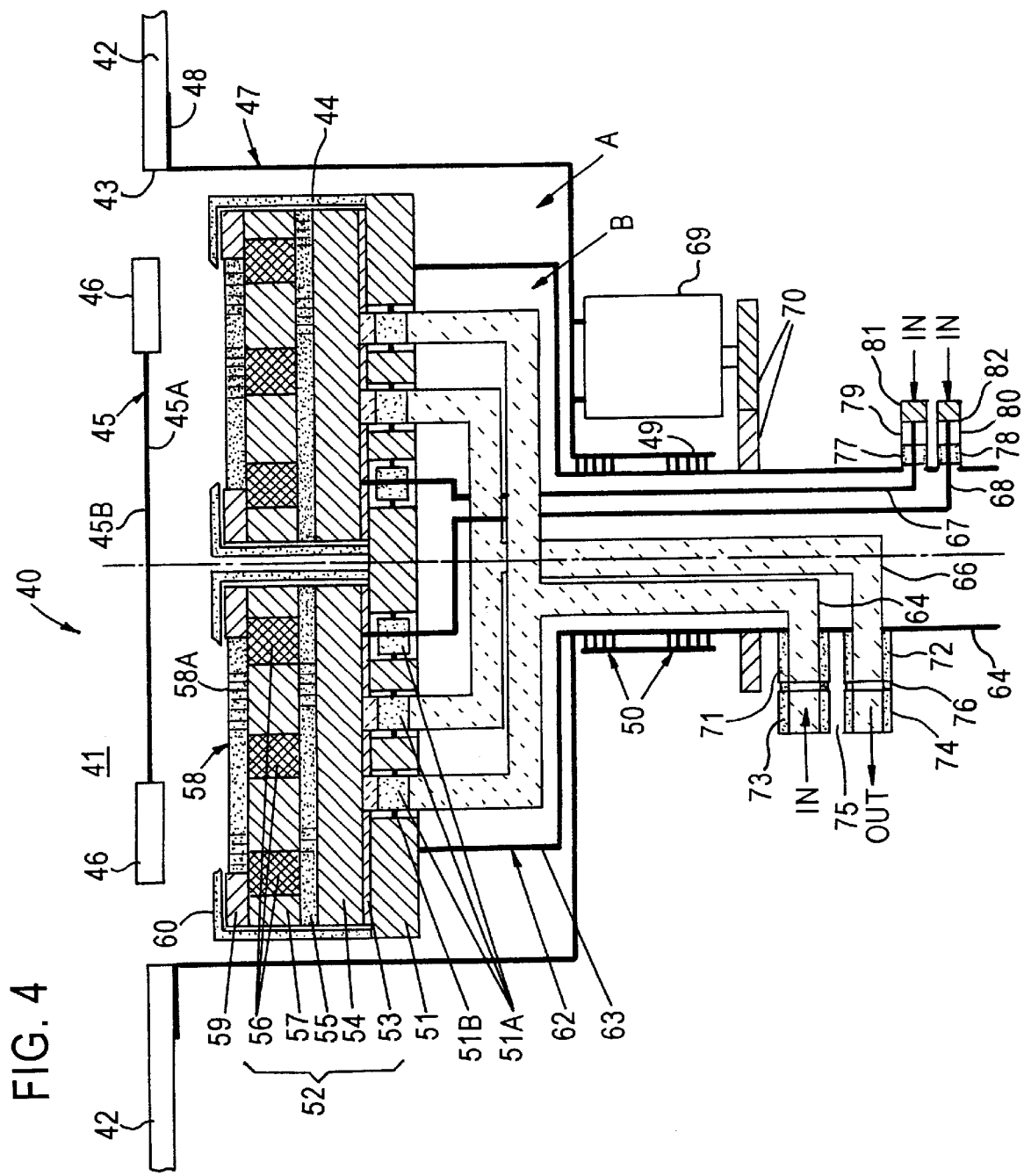
FIG. 4 is a simplified schematic, cross-sectional view illustrating the essential features of a rotating multiple planar magnetron sputtering source according to the present invention.

Referring now to FIG. 4, shown therein in schematic, simplified cross-sectional view, is an embodiment of an apparatus 40 according to the present invention, adapted for forming multilayer thin film stacks or superlattice structures on annularly-shaped deposition surfaces of disk substrates utilized in the manufacture of magnetic and magneto-optical (MO) recording media. Apparatus 40 comprises a vacuum chamber or enclosure 41 including a chamber wall 42 having an opening 43 therein for positioning rotating multiple planar magnetron cathode assembly 44 in spaced, confronting relation to the lower surface 45A of annularly-shaped disk substrate 45 held stationary by substrate mounting means 46. A similar rotating multiple planar magnetron cathode assembly (not shown for illustrative simplicity) may be provided in spaced, confronting relation to the upper surface 45B of substrate 45 for manufacture of dual-sided media. Rotating multiple cathode assembly 44 is nested within a pot-shaped mounting enclosure 47 including an upper flange portion 48 adapted for vacuum-tight fastening to vacuum chamber wall 42 (by means not shown) and a lower flange portion 49 for accomodating at its inner side a rotary vacuum seal/bearing 50 (described in more detail below).

Rotating multiple planar magnetron cathode assembly 44 comprises a base plate 51 for mounting thereon each of the plurality of substantially similarly structured, independently operable, planar magnetron cathode/target assemblies 52 (only two of which are visible in the figure) and is provided with a plurality of openings extending therethrough for accommodating vacuum-sealed feedthroughs each comprising an electrical insulator 51A having an interior passage and surrounding vacuum seals 51B (e.g., O-rings or ceramic-to-metal brazement) for supplying coolant fluid and electrical power to each of the cathode/target assemblies 52. The upper surface of base plate 51 is provided with a layer of electrical insulation 53 for electrical isolation of each cathode/target assembly 52 from the base plate and from other cathode/target assemblies. Each of the substantially similarly structured, circularly-shaped planar magnetron cathode/target assemblies 52 comprises a water-cooled copper (Cu) cathode 54 in overlying contact with insulating layer 53, a magnetic yoke or pole piece 55, a magnetron magnet assembly 56 comprising central and outer circumferential magnets received within corresponding recesses formed within a copper magnet holding block 57, a circularly-shaped target 58 including a sputtering surface 58A composed of a material desired to be sputtered onto the lower surface 45A of substrate 45 held stationary in opposing relation to target surface 58A by substrate mounting means 46. Completing the cathode/target assembly are target clamp 59 and ground shield 60, each extending around the circumference of target 58. At least one vertically extending shield or baffle 61 (see FIG. 5) is provided in the space between adjacent targets 58 for substantially reducing or eliminating cross-contamination of the sputtered particle flux emanating from each target and provide flux collimation. Preferably, the at least one shield or baffle 61 is mechanically secured to the ground shield 60 and extends toward substrate surface 45A as close as mechanical tolerances permit. Each shield or baffle 61 may also advantageously, and without increase in mechanical complexity, include a contoured mask attached thereto for controlling, i.e., improving, the radial thickness profile or uniformity of each deposited layer.

A pot-shaped feedthrough housing 62 having a wider diameter upper portion 63 is fastened to the lower surface of base plate 52 in a vacuum-tight manner, as by welding or other suitable means, and surrounds the outermost feedthrough. A narrower diameter lower "throat" portion 64 of feedthrough housing 62 extends downwardly from the wider diameter upper portion 63 to form a hollow cylindrical shaft for accommodating therein coolant inlet and outlet conduits 65 and 66, respectively, and respective electrical power supply lines 67 and 68 for each cathode/target assembly 52. The narrower diameter throat portion 64 of the feedthrough housing 62 is rotatably supported in a vacuum-tight manner at its upper end by rotary vacuum seal/bearing means 50, e.g., a ferrofluidic seal, provided at the interior surface of lower flange portion 49 of mounting enclosure 47. Rotation of the multiple planar magnetron cathode/target assembly via the rotatably supported throat portion 64 of feedthrough housing 62 is provided, e.g., by means of a motor 69 and suitable mechanical linkage 70.

As shown, the coolant inlet and outlet conduits 65 and 66, respectively, and electrical power supply lines 67 and 68 each extend through the sidewall of the throat portion 64 below the rotary vacuum seal 50. The coolant inlet and outlet conduits terminate in respective ring-shaped "rotors" 71 and 72 which extend around the circumference of the throat portion 64 (not shown in the drawing for illustrative simplicity) below the rotary vacuum seal 50 and are mated to respective ring-shaped "stators" 73 and 74 via respective sliding water seals 75 and 76, the stators in turn being connected to stationary coolant fluid supply and return lines. The seal diameter is made as small as is practicable in order to minimize heat generation and wear in the sliding seal, and to minimize required motor torque. These goals are facilitated by running only a single pair of coolant supply (i.e., inlet) and return (i.e., outlet) lines through the throat portion 64 of the feedthrough housing 62 and routing the lines to the copper cathodes 54 either in parallel (as shown) or in series in the more spacious volume of the upper portion 63 of the feedthrough housing 62, with appropriate isolation therebetween to avoid electrical cross-talk between the cathode/target assemblies 52 through the coolant fluid (e.g., water).

Electrical power is supplied to the various cathode/target assemblies 52 in a similar fashion. As illustrated, each of the power lines 67 and 68 for energizing the illustrated pair of cathode/target assemblies 52 extends through the sidewall of the lower, throat portion 64 of the feedthrough housing 62 below the rotary vacuum seal 50, passes through a respective electrical insulator 77 or 78, and terminates in a respective electrically conductive "rotor" ring 79 or 80 extending around the circumference of the throat portion 64 (not shown in the drawing for illustrative simplicity), which rotor rings make sliding contact with respective mating "stators" 81 or 82. Carbon brush stators such as are employed as commutators in electric motors are usable for DC transmission applications. An additional sliding electrical contact can, if necessary, be provided for electrical grounding of the feedthrough housing 62.

According to the above-described arrangement, only the space A between the mounting enclosure 47 and the feedthrough housing 62 is maintained under vacuum, i.e., the space B between the feedthrough housing 62 and the lower surface of the base plate 51 with its associated coolant fluid conduits and electrical power supply lines, is maintained at atmospheric pressure due to the use of vacuum-sealed feedthroughs (comprising electrical insulators 51A and associated vacuum seals 51B, e.g., O-rings, etc.) passing through the base plate. An advantage obtained by such arrangement is that the integrity of the sliding coolant fluid seals has no impact on the critical process vacuum within chamber 41.

The above-described rotating multiple magnetron cathode device can be utilized as one station of a multi-station apparatus for continuous, automated manufacturing processing. In operation, each of the cathode/target assemblies 52 can be continuously energized during the deposition phase for maximum productivity. Any given point on the surface 45A of the stationary disk substrate 45 is sequentially coated as each sputtering target 58 passes by to build up the multilayer or superlattice in a spiral-shaped fashion. While a single pair of targets 58 can provide a reasonable degree of radial uniformity, e.g., a uniform thickness profile, by careful placement of the targets relative to the substrate, the control of radial properties afforded by such arrangement is limited. Advantageously, according to the invention, the number of cathode/target assemblies 52 and associated sputtering targets 58 is not limited to two (2) as in the embodiment illustrated in FIG. 4. Several possible alternative arrangements or arrays of four (4) circularly-shaped sputtering targets 58 are illustrated in plan view in FIGS. 5(A)–5(D), it being understood that each associated cathode/target assembly 52 is supplied with electrical power independently of the other cathode/target assemblies of the array, as described above and illustrated in FIG. 4. Further, each of the cathode/target assemblies of the array is supplied with coolant fluid via the inlet/outlet conduit 65, 66 arrangement shown in FIG. 4, with the fluid flow to and from the copper cathodes 54 taking a series, parallel, or series-parallel path.

Referring now to FIG. 5(A), shown therein is a "symmetrical" arrangement or array of two (2) pairs of circularly-shaped, equal diameter sputtering targets 58, e.g., two (2) Co targets and two (2) Pt targets, which arrangement provides an increased deposition rate and/or longer target life vis-à-vis a one (1) pair, two (2) target arrangement such as illustrated in FIG. 4. Sputtering shields or baffles 61, described above, are shown as positioned between adjacent sputtering targets 58 for reducing or eliminating cross-contamination of sputtered particle flux of each target and to collimate the flux. Depending upon the size of the sputtering target 58 relative to the disk substrate 45, the position size, and/or orientation of the target pairs can be arranged to achieve a desired degree of radial uniformity, e.g., thickness profile, or to achieve intentional radial gradients in film properties. Generally, good radial thickness profiles are obtained when the outer circumferential edge 45C of the disk-shaped substrate 45 is located approximately above the center of the sputtering target surface 58A, as in the embodiment illustrated in FIG. 4. Other arrangements or arrays of four (4) circularly-shaped sputtering targets are possible according to the invention, which arrangements can provide enhance control of the radial thickness profile, e.g., an "unsymmetrical" arrangement or array of identically-sized, circularly-shaped targets 58, as shown in FIG. 5(B); or an arrangement or array of differently-sized, circularly-shaped targets 58, as in FIG. 5(C), which array provides a greater degree of asymmetry than the array of FIG. 5(B); and a "tilted" arrangement or array of four (4) circularly-shaped targets 58, as in FIG. 5(D), wherein one of the two pairs of symmetrically positioned circularly-shaped targets is provided such that each of the sputtering surfaces thereof is parallel to the planar end face of the sputtering source and each of the sputtering surfaces of the other pair is tilted at an angle with respect to the planar end face of the sputtering source for directing the sputtered particle flux toward a particular radial position of the substrate. In any case, excellent circumferential uniformity of deposition, desirable for high rpm disk performance, results naturally from the rotational averaging effect arising from the rotating cathode geometry.

The present invention can utilize a 4 sputtering target source for coating conventional 95 mm diameter disk substrates for magnetic and magneto-optical recording media, utilizing sputtering targets having a diameter of from about 1 to about 3 inches. A particular advantage of the present invention is the ability to utilize industry-standard 2 inch diameter targets, thereby increasing the economic competitiveness of the inventive methodology. Utilizing commercially available disk production machines having a cycle time of from about 5 to about 10 seconds, a superlattice spiral comprising about 10 to about 20 Co/Pt or Co/Pt bi-layers (i.e., $(Co/Pt)_{10-20}$ or $(Co/Pd)_{10-20}$) can be formed with a multi-cathode sputtering source rotational speed of about 120 rpm, although rotational speeds up to about 1000 rpm are possible according to the present invention. Typical DC power requirements for sputtering from 2 inch diameter targets for forming Co/Pt and/or Co/Pd superlattices as described above are from about 150 watts to about 700 watts, with lower power preferred in order to provide for adequate target cooling.

A number of advantages are provided by the inventive apparatus and methodology when utilized for automated manufacture of disk-shaped recording media, in addition to those described supra. Specifically, a continuous production time of about 24 hours between target changes is possible; the small diameter, circularly-shaped targets do not require a backing plate or complex clamp fixturing for mounting against the magnet assembly and thus target changes can be performed very quickly, e.g., on the order of about 1 minute; and the cathode assembly can be hingedly mounted to the vacuum chamber, thereby facilitating target access for replacement and maintenance without disconnection of the coolant fluid conduits and power leads. Finally, a second, substantially identically configured rotating planar magnetron cathode sputtering source may be provided for multilayer or superlattice deposition on the opposite substrate surface, as in the manufacture of dual-sided magnetic and MO recording media.

Thus, the present invention advantageously provides a method and apparatus for forming multilayer thin film stacks and superlattice structures by providing a rotating multiple planar magnetron cathode sputtering source in combination with a stationary substrate. The rotating multiple cathode planar magnetron sputtering source has been designed to provide robust performance when utilized as part of an economically competitive, continuous, automated multi-station processing apparatus such as is employed for the manufacture of disk-shaped magnetic and/or magneto-optical (MO) recording media. According to the invention, the only moving seal exposed to vacuum conditions is the ferrofluid seal between the feedthrough housing and the vacuum enclosure. The inventive methodology and apparatus are not limited to forming the specifically disclosed magnetic and/or magneto-optical (MO) recording media rather, the invention is broadly applicable to the deposition of various types of products requiring multilayer films or coatings, e.g., optical coatings such as interference filters and reflectors.

In the previous description, numerous specific details are set forth, such as specific materials, structures, processes, etc., in order to provide a better understanding of the present invention. However, the present invention can be practiced without resorting to the details specifically set forth. In other instances, well-known processing techniques and structures have not been described in detail in order not to unnecessarily obscure the present invention.

Only the preferred embodiments of the present invention and but a few examples of its versatility are shown and described in the present disclosure. It is to be understood that the present invention is capable of use in various other combinations and environments and is susceptible of changes and/or modifications within the scope of the inventive concept as expressed herein.

What is claimed is:

1. A method of forming a spiral-shaped multilayer thin film on a substrate surface, comprising the steps of:
   (a) providing a sputtering source having a planar end face with a central axis for rotation thereabout, said end face comprising at least one pair of first and second independently and simultaneously operable cathodes positioned in an array about said central axis and including respective first and second sputtering targets comprised of first and second target materials;
   (b) providing a substrate having a surface for deposition thereon in spaced-apart, facing relation to said first and second sputtering targets;
   (c) simultaneously sputtering said first and second targets while rotating said end face of said sputtering source about said central axis and maintaining said substrate stationary during said simultaneous sputtering of said first and second targets, thereby simultaneously depositing on said substrate surface material sputtered from said first and second targets to form a spiral-shaped multilayer thin film on said substrate surface, said spiral-shaped multilayer thin film comprising alternating layers of said first and second target materials.

2. The method according to claim 1, wherein:
step (a) comprises providing a sputtering source including at least one pair of first and second planar magnetron cathodes and shielding means between said cathodes for substantially reducing or eliminating contamination of the sputtered particle flux from each sputtering target.

3. The method according to claim 2, wherein:
step (a) comprises providing a sputtering source including two pairs of first and second planar magnetron cathodes.

4. The method according to claim 3, wherein:
step (a) comprises providing a sputtering source wherein each of the planar magnetron cathodes includes a sputtering target having a circularly-shaped sputtering surface.

5. The method according to claim 4, wherein:
step (a) comprises providing a sputtering source wherein each circularly-shaped sputtering surface is of the same diameter.

6. The method according to claim 5, wherein:
step (a) comprises providing a sputtering source wherein two pairs of said circularly-shaped sputtering surfaces are arranged in a symmetrical array about said central axis.

7. The method according to claim 6, wherein:
step (a) comprises providing a sputtering source wherein one pair of first and second planar magnetron cathodes includes first and second sputtering targets having circularly-shaped sputtering surfaces, the other pair of first and second planar magnetron cathodes includes first and second sputtering targets having circularly-shaped sputtering surfaces each of which is tilted at an angle with respect to said planar end face of said sputtering source, and the two pairs of sputtering surfaces are arranged in a symmetrical array about said central axis.

8. The method according to claim 5, wherein:
step (a) comprises providing a sputtering source wherein two pairs of said circularly-shaped sputtering surfaces are arranged in an unsymmetrical array about said central axis.

9. The method according to claim 4, wherein:
step (a) comprises providing a sputtering source wherein one pair of said circularly-shaped sputtering surfaces is of a first, larger diameter, the other pair of said circularly-shaped sputtering surfaces is of a second, smaller diameter, and the two pairs of said sputtering surfaces are arranged in a symmetrical array about said central axis.

10. The method according to claim 1, wherein:
step (b) comprises providing a disk-shaped substrate having an annularly-shaped surface for deposition thereon; and
step (c) comprises depositing a $(Co/Pt)_n$ or $(Co/Pd)_n$ multilayer stack or superlattice structure, where n is an integer from about 10 to about 30, on an annularly-shaped deposition surface of a disk-shaped substrate as part of a process for forming a magnetic or magneto-optical (MO) recording medium.

11. An apparatus for depositing a spiral-shaped multilayer thin film on a substrate surface, comprising:
   (a) a sputtering source having a planar end face adapted for rotation about a central axis, said end face comprising at least one pair of first and second independently and simultaneously operable cathodes positioned in an array about said central axis, said first and second cathodes adapted to mount thereon respective first and second sputtering targets comprised of first and second target materials;
   (b) a substrate mount for providing a substrate surface in stationary, spaced-apart, facing relation to said pair of first and second sputtering targets; and
   (c) means for rotating said end face of said sputtering source about said central axis such that material sputtered from each of said targets is simultaneously deposited on said substrate surface to form thereon a spiral-shaped multilayer film comprising alternating layers of said target materials.

12. The apparatus as in claim 11, wherein:
said sputtering source (a) comprises at least one pair of planar magnetron cathodes and further includes shielding means between said cathodes for substantially reducing or eliminating contamination of the sputtered particle flux from each sputtering target.

13. The apparatus as in claim 12, wherein;
said sputtering source (a) comprises two pairs of first and second planar magnetron cathodes.

14. The apparatus as in claim 13, wherein:
each of said planar magnetron cathodes includes a sputtering target having a circularly-shaped sputtering surface.

15. The apparatus as in claim 14, wherein:
each said circularly-shaped sputtering surface is of the same diameter and the two pairs thereof are arranged in a symmetrical or unsymmetrical array about said central axis.

16. The apparatus as in claim 14, wherein:
one pair of said circularly-shaped sputtering surfaces is of a first, larger diameter, the other pair of said circularly-shaped sputtering surfaces is of a second, smaller diameter, and the two pairs of said sputtering surfaces are arranged in a symmetrical array about said central axis.

17. The apparatus as in claim 14, wherein:
one pair of first and second planar magnetron cathodes includes first and second targets having circularly-shaped sputtering surfaces parallel to said planar end face of said sputtering source, the other pair of first and second planar magnetron cathodes includes first and second sputtering targets having circularly-shaped sputtering surfaces each of which is tilted at an angle with respect to said planar end face of said sputtering source, and the two pairs of sputtering surfaces are arranged in a symmetrical array about said central axis.

18. The apparatus as in claim 13, further comprising:
   (d) means for independently supplying sputtering power to each of said first and second pairs of planar magnetron cathodes.

19. The apparatus as in claim 18, further comprising:
   (e) means for supplying coolant fluid to each of said planar magnetron cathodes.

20. An apparatus for forming a spiral-shaped multilayer thin film on a substrate surface, comprising:
   a sputtering source including a planar end face rotatable about a central axis thereof and comprising a plurality of independently and simultaneously operable planar magnetron cathode sputtering targets; and
   means for providing a substrate surface in stationary, facing relation to said sputtering targets for deposition of a spiral-shaped multilayer thin film thereon comprised of alternating layers of material sputtered from said plurality of targets.

* * * * *